(12) United States Patent
Wilcox et al.

(10) Patent No.: US 10,707,600 B1
(45) Date of Patent: Jul. 7, 2020

(54) SYSTEMS WITH ELECTRICAL ISOLATION BETWEEN SIGNAL AND POWER DOMAINS

(71) Applicant: Arista Networks, Inc., Santa Clara, CA (US)

(72) Inventors: Robert Wilcox, Saratoga, CA (US); Richard Hibbs, Redwood City, CA (US); Rui Jia, Pleasanton, CA (US); Michael Bowman, Palo Alto, CA (US)

(73) Assignee: Arista Networks, Inc., Santa Clara, CA (US)

( * ) Notice: Subject to any disclaimer, the term of this patent is extended or adjusted under 35 U.S.C. 154(b) by 0 days.

(21) Appl. No.: 16/457,767

(22) Filed: Jun. 28, 2019

(51) Int. Cl.
  *H01R 12/58* (2011.01)
  *H01R 25/00* (2006.01)
  *H05K 1/18* (2006.01)
  *H05K 1/11* (2006.01)

(52) U.S. Cl.
  CPC .......... *H01R 12/58* (2013.01); *H01R 25/006* (2013.01); *H05K 1/115* (2013.01); *H05K 1/184* (2013.01); *H05K 2201/041* (2013.01); *H05K 2201/043* (2013.01); *H05K 2201/09072* (2013.01); *H05K 2201/10189* (2013.01)

(58) Field of Classification Search
  CPC .......... H05K 1/18; H05K 1/184; H05K 1/115; H05K 2201/10189; H05K 2201/09072; H05K 2201/041; H05K 2201/043; H01R 12/58; H01R 25/006
  USPC .................................... 439/79; 174/260–262
  See application file for complete search history.

(56) References Cited

U.S. PATENT DOCUMENTS

| | | | | |
|---|---|---|---|---|
| 4,869,676 A * | 9/1989 | Demler, Jr. | .......... | H01R 23/688 439/79 |
| 4,909,743 A * | 3/1990 | Johnson | ............... | H01R 12/724 439/60 |
| 5,315,069 A * | 5/1994 | Gebara | ................ | H05K 1/0218 174/250 |
| 5,397,241 A * | 3/1995 | Cox | ........................ | H01R 24/50 439/63 |
| 6,760,232 B2 * | 7/2004 | Smith | .................. | H05K 1/0263 174/260 |
| 7,004,675 B2 * | 2/2006 | Wayne | ................... | E01C 23/065 299/39.6 |
| 7,748,996 B2 * | 7/2010 | Wang | ................. | H01R 13/6675 439/79 |
| 7,833,026 B1 * | 11/2010 | Morgan | ................. | H01R 12/52 439/108 |
| 7,988,461 B1 * | 8/2011 | Morgan | ............. | H01R 13/6461 439/78 |

(Continued)

*Primary Examiner* — Gary F Paumen
(74) *Attorney, Agent, or Firm* — Haley Guiliano LLP

(57) ABSTRACT

The system includes power-over-ethernet (PoE) sockets that interface to dedicated power and signal printed circuit boards. More particularly, the system separates power transmission circuitry from signal transmission circuitry for PoE arrays of RJ-45 sockets. The sockets include pins of different length to accommodate a stacked configuration of the power board and signal board. The pins corresponding to higher-voltage powers are a different length than lower-voltage signal pins. More than one PoE connector array may be coupled to a stack printed circuit boards, with pins of varying length, configured to engage with respective boards of the stack. The boards of the stack may be electrically isolated from each other, although the boards may be structurally engaged with each other.

20 Claims, 7 Drawing Sheets

(56) References Cited

U.S. PATENT DOCUMENTS

| | | | | |
|---|---|---|---|---|
| 8,944,830 B2* | 2/2015 | Little | ............... | G02B 6/4284 |
| | | | | 439/79 |
| 2006/0175083 A1* | 8/2006 | Muramatsu | ............ | H01G 2/06 |
| | | | | 174/260 |
| 2008/0236876 A1* | 10/2008 | Kodama | ............... | G02B 6/43 |
| | | | | 174/260 |
| 2008/0277153 A1* | 11/2008 | Teshome | ............ | H05K 1/0216 |
| | | | | 174/262 |
| 2012/0155043 A1* | 6/2012 | Miyasaka | ........... | H05K 1/0231 |
| | | | | 361/782 |
| 2014/0118962 A1* | 5/2014 | Sabavat | ............. | H05K 1/0224 |
| | | | | 361/748 |
| 2015/0264801 A1* | 9/2015 | Martin | ............... | H05K 1/0218 |
| | | | | 361/760 |

\* cited by examiner

SYSTEMS WITH ELECTRICAL ISOLATION BETWEEN SIGNAL AND POWER DOMAINS

BACKGROUND

Electrical isolation in electronic devices ensures safe, reliable operation. Devices, such as network devices, having power circuitry and data signal circuitry in close proximity, must be designed with electrical isolation in view. For example, Power-over-Ethernet (PoE) systems typically use 54 Volts to supply power and 12 Volts to transfer data among connected devices. This arrangement can present challenges such as isolating the electric power circuitry from the data signal circuitry. Although electrical isolation may be accomplished within the inner layers of a printed circuit board (PCB), this may require quite a bit of spacing between domains thus causing routing space to be wasted.

SUMMARY

A system for providing power and data signal functionality includes separate data signal and power domains. A connector array includes one or more sockets, a set of signal pins, and a set of power pins. The signal pins and power pins are sized and arranged to engage with the respective signal domains and power domains. In some embodiments, the signal domain and power domain are separate domains of a single PCB. In some embodiments, the signal domain and power domain are implemented as separate PCBs, which may be stacked.

BRIEF DESCRIPTION OF THE DRAWINGS

The present disclosure, in accordance with one or more various embodiments, is described in detail with reference to the following figures. The drawings are provided for purposes of illustration only and merely depict typical or example embodiments. These drawings are provided to facilitate an understanding of the concepts disclosed herein and shall not be considered limiting of the breadth, scope, or applicability of these concepts. It should be noted that for clarity and ease of illustration these drawings are not necessarily made to scale.

DETAILED DESCRIPTION

The present disclosure is directed to systems for providing isolated electric power and data signal circuitry. Network devices may be communicatively coupled to a network by one or more wired connections. For example, a device may be coupled to a local area network (LAN), a wide area networks (WAN), one or more other network devices, or any combination thereof by ethernet cables. The ethernet cables may include, for example, twisted pair Cat X cables (e.g., wherein X is 3, 4, 5, 5e, 6, 6A, 7, 7A, 8, 8.2 or other designator), and the end terminations may include RJ-45 connectors (e.g., any suitable connectors with 8 pins that are all connected). In an illustrative example, a network router, network switch, a patch panel, or other suitable network device may include one or more arrays of communication sockets (e.g., RJ-45 sockets). The arrays are typically arranged as rows having some suitable number of connectors per row. Network devices may be included in a 19" rack mount structure, having a suitable rack unit (U) height (e.g., having 1U, 2U, or greater device heights), configured for table top operation, integrated into a computing device or other network device (e.g., which may include a single PoE connector, or more than one PoE connector), any other suitable implementation, or a combination thereof. In addition to signaling used for network communication, the device may be configured to provide PoE functionality, in which electric power is transmitted over some conductors of a cable and network signals are transmitted over other conductors of the cable. Accordingly, a device may include one or more ethernet cards/adapters/converters, one or more power supplies (e.g., for providing 12 Volts, 54 Volts, any other suitable DC voltage, or any combination thereof), associated circuitry, any other suitable circuitry, or any combination thereof. The combination of electric power and signal at a network connector requires electrical isolation at the network adapter, near the sockets, as contrasted from ethernet systems that do not include pins for electric power transmission. In an illustrative example, the electrical isolation rated for 2 kV may be required between circuitry of the signal domain and circuitry of the power domain. While the connectors illustrated in FIGS. 1A-7 may include RJ-45 type connectors, the systems and assemblies of the present disclosure may be applied to any suitable connector-type and communication protocol that transmits both electric power and data signals, isolated from one another.

Figure 1B:
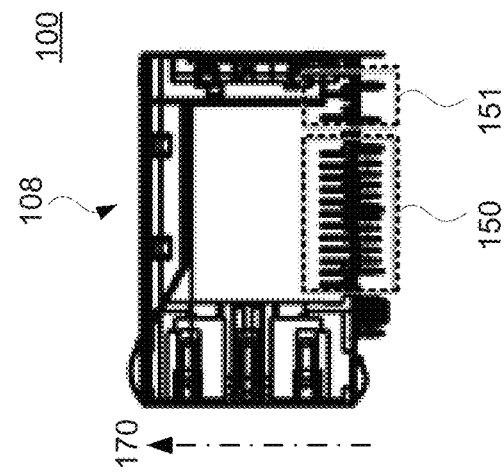
FIG. 1B shows a side view of the illustrative connector array of FIG. 1A, in accordance with some embodiments of the present disclosure.
Figure 1A:
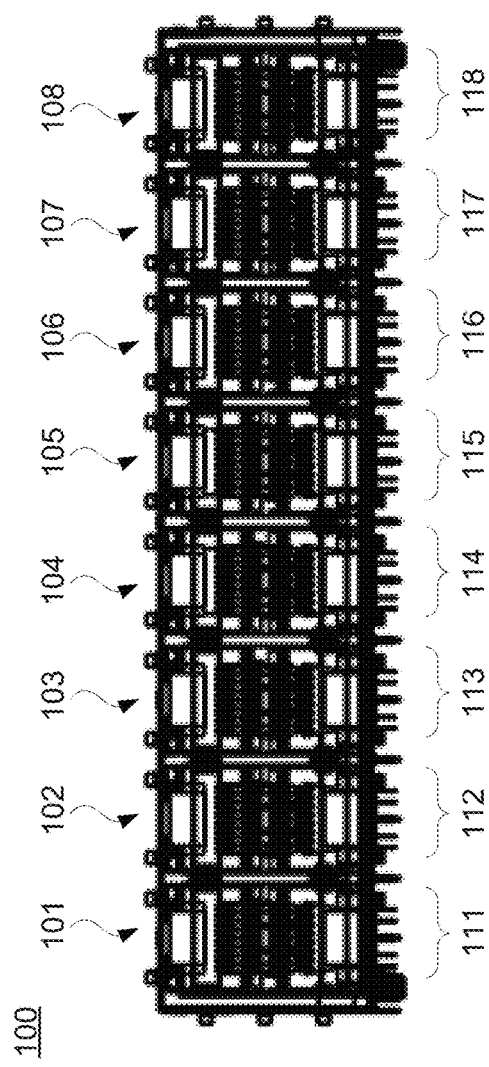
FIG. 1A shows a front view of an illustrative connector array, in accordance with some embodiments of the present disclosure.
Figure 1C:
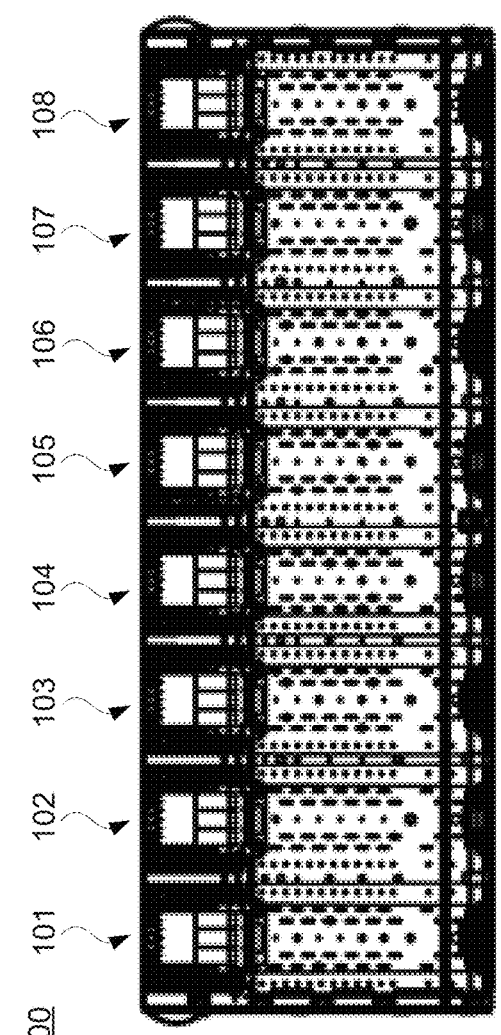
FIG. 1C shows a bottom view of the illustrative connector array of FIG. 1A, in accordance with some embodiments of the present disclosure.

FIG. 1A shows a front view of illustrative connector array 100, in accordance with some embodiments of the present disclosure. FIG. 1B shows a side view of illustrative connector array 100, in accordance with some embodiments of the present disclosure. FIG. 1C shows a bottom view of illustrative connector array 100, in accordance with some embodiments of the present disclosure. As illustrated, connector array 100 includes eight RJ-45 sockets 101-108 arranged in a one-dimensional (1-D) array, although a connector array may include any suitable number of sockets (e.g., one, two, or more than two sockets) in any suitable arrangement. Each socket includes a recess for accommodating a male RJ-45 connector. For each socket of connector array 100, a set of pins extends away from the socket (e.g., sets of pins 111-118, as illustrated). The pins are arranged to engage corresponding electrical terminals of one or more PCBs (e.g., PCBs of a network adapter). As shown in FIG. 1B, which is a side view showing socket 108 particularly, pins 118 may be partitioned by function (e.g., signal pins 150 and power pins 151). In some embodiments, signal pins 150 may be grouped and spatially separated from power pins 151, which may be also grouped. In some embodiments, sets of pins 111-118 include shielding pins, which may electrically connect shielding of each socket to a chassis ground, a ground plane, or other suitable electrical reference. Axis 170 corresponds to a direction away from a PCB with which connector array 100 engages. For example, direction in the plane normal to axis 170 are referred to as "in-plane," lying substantially in the plane of any PCBs. For example, in some embodiments, connector array 100 engages with one or more mating PCBs in a direction along axis 170 (e.g., downwards as illustrated in FIG. 1B), with circuitry of the one or more PCBs arranged primarily in-plane. Multiple PCBs may be stacked along axis 170, thus forming a multiple planes substantially parallel to each other and normal to axis 170.

In some embodiments, the present disclosure is directed to systems having separate signal and power domains (e.g., PCBs or planes thereof) while keeping the PCB space waste (e.g., footprint, thickness, or other spatial metric) to a minimum. For example, a connector may include signal pins and power pins separately connected to different PCBs or different layers inside the same PCB. Accordingly, the power domain(s) are physically isolated already and no additional isolation is needed. In a further example, this approach also enables the use of different PCB materials, resolution, and topology for the power domain as compared to the signal domain. To illustrate, relatively cheaper PCB material can be used for the 54 V power domain where signal integrity is not a primary concern, thus leaving the signal domain to be separately designed for signal transmission (e.g., where signal integrity is a primary concern). In an illustrative example, by fabricating a power board separately from a signal board, the probability of a fault or error during fabrication is reduced (e.g., preventing wasted processing resources and cost).

Figure 2:
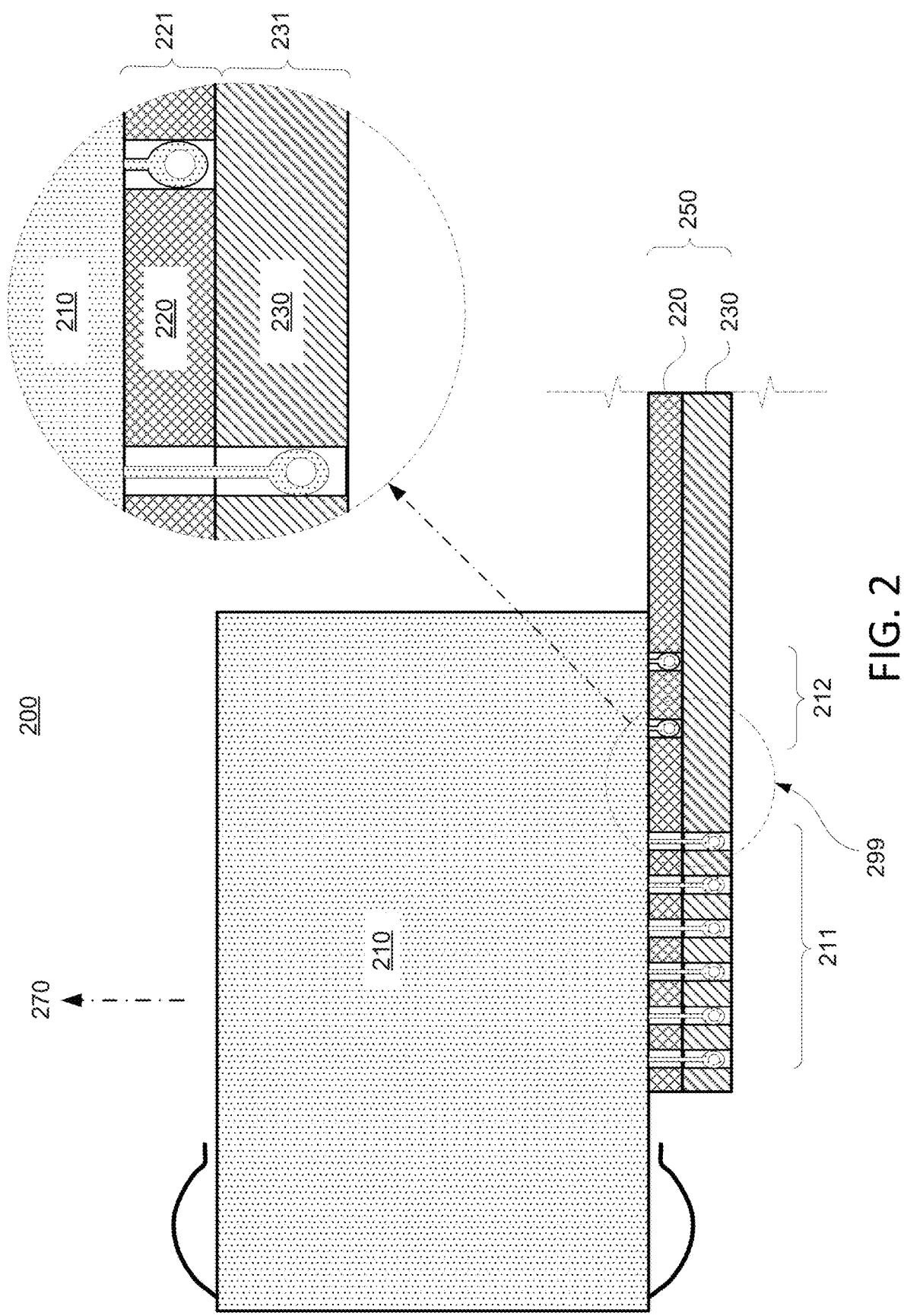
FIG. 2 shows a cross-sectional side view of an illustrative connector coupled to a power PCB and signal PCB, in accordance with some embodiments of the present disclosure.

FIG. 2 shows a cross-sectional side view of illustrative connector 210 coupled to power PCB 220 and signal PCB 230, in accordance with some embodiments of the present disclosure. Assembly 200 includes stack 250, which includes power PCB 220 and signal PCB 230, and a connector array that includes connector 210 (e.g., a RJ-45 socket for PoE). Connector 210 includes signal pins 211 and power pins 212 (shield pins are not illustrated but may be included in some embodiments). Signal pins 211 (e.g., six pins as illustrated), which are longer than power pins 212 as illustrated, pass through power PCB 220 without electrically contacting electronic circuitry or conductors of power PCB 220, and engage with corresponding electrical terminals of signal PCB 230. Power pins 212 (e.g., two pins as illustrated) engage with corresponding electrical terminals of power PCB 220. Signal pins 211, power pins 212, or both, may be sized to provide mechanical retention, electric current capacity, electrical isolation, any other suitable consideration, or any combination thereof.

In some embodiments, power PCB 220 and signal PCB 230 are mechanically affixed to each other to provide stiffness. In some embodiments, engagement of signal pins 211 with signal PCB 230 and engagement of power pins 212 with power PCB 220 provides mechanical affixing. For example, signal pins 211, power pins 212, or both, may engage respective PCBs by a press fit with corresponding terminals (as illustrated), mechanical crimping, soldering, any other suitable technique for affixing pins of a socket to a PCB, or any combination thereof.

The arrangement of signal pins 211 connected to signal domain 231 and power pins 212 connected to power domain 221 may forgo the need for further electrical isolation partially or entirely. For example, power PCB 220 and signal PCB 230 may be designed to provide necessary electrical isolation at their mating interface. In some embodiments, an isolation layer may be included between power PCB 220 and signal PCB 230. In some embodiments, signal PCB 230 is of the same design as a non-PoE board, and power PCB 220 includes electrical isolation at the interface with signal PCB 230. Accordingly, in some circumstances, the assemblies of the present disclosure allow less expensive and intrusive electric power isolation between the signal pin field (e.g., such as signal pins 211) and power pin field (e.g., such as power pins 212) of the corresponding one or more PCBs.

Axis 270 provides an indicator of direction of assembly 200. For example, connector 210, which may include a RJ-45 connector, is stacked over power PCB 220, which is stacked over signal PCB 230. Although not shown in FIG. 2, connector 210 may be one connector of a plurality of connectors of a connector array. Power PCB 220 and signal PCB 230 may each include a plurality of corresponding sets of electrical terminals with which the signal pins and power pins engage.

Although not illustrated in FIG. 2, a power PCB and a signal PCB may be stacked in a different order. For example, in some embodiments, a signal PCB is stacked over a power PCB, and accordingly, the power pins are longer than the signal pins and pass through the signal PCB without electrically contacting the signal PCB or conductors thereof. Any suitable arrangement of power PCB and signal PCB may be used in accordance with the present disclosure.

Because power PCB 220 may be designed and fabricated separate from signal PCB 230, the properties of both power PCB 220 and signal PCB 230 may be tuned under separate constraints. For example, signal PCB 230 may be designed and fabricated the same as a dedicated ethernet adapter not configured for electric power transmission. Accordingly, cost and resources may be saved by not re-designing the signal domain. Further, addition of a power domain need not impact the design and fabrication of signal domain (e.g., by adding features or layers), which could cause manufacturing failures and waste. The power domain can be designed to accommodate electric power circuitry without regard to signal circuitry aside from isolation. To illustrate, the addition of a power PCB to an existing signal PCB (of existing design or slightly-modified design) allows a relatively cheaper power domain to be added without significantly modifying the signal domain. Because each of the power domain and signal domain can be tailored to their respective functions, efficiency may be increased, and cost may be reduced.

Figure 3:
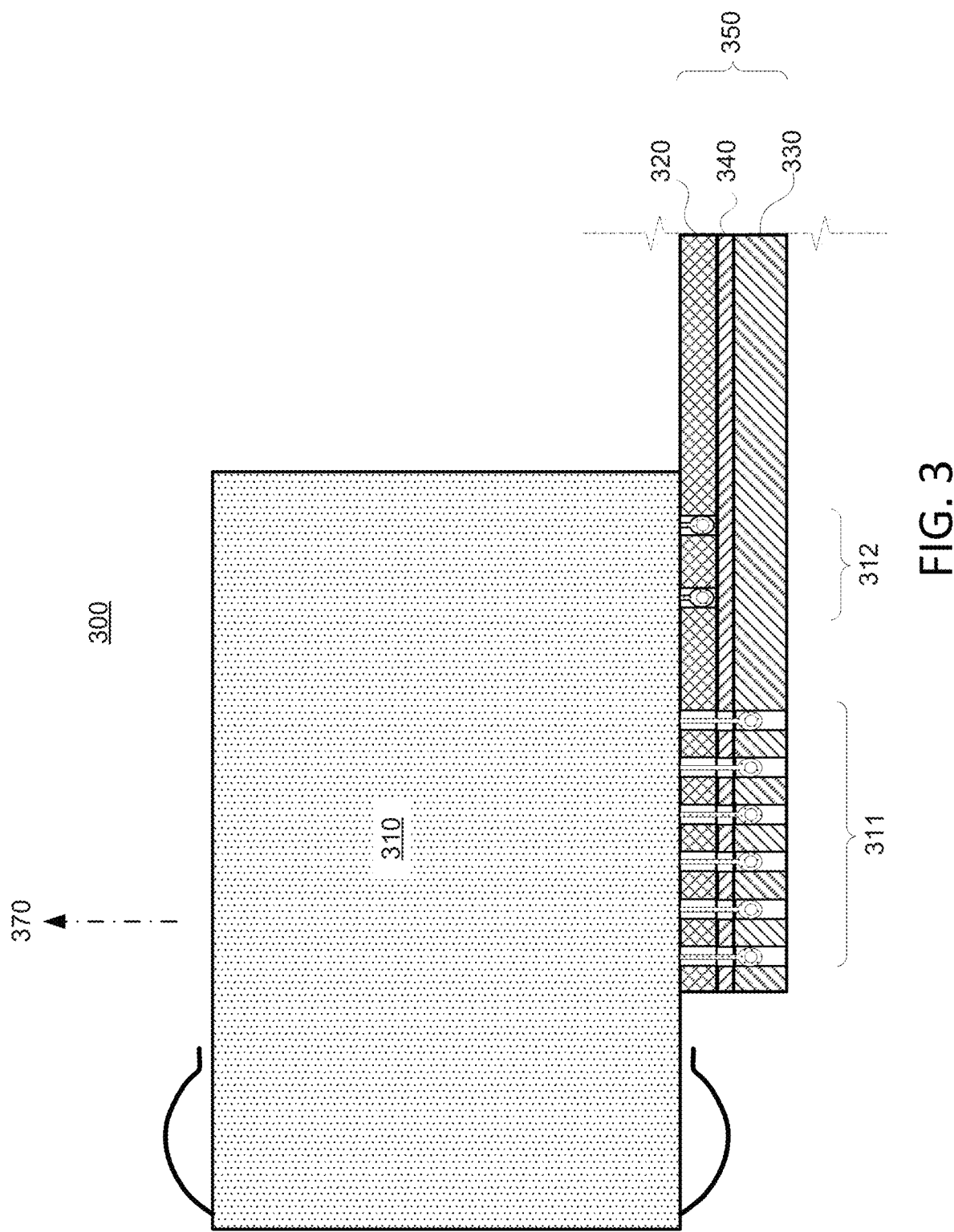
FIG. 3 shows a cross-sectional side view of an illustrative connector coupled to a power PCB and signal PCB, with an isolation layer, in accordance with some embodiments of the present disclosure.

FIG. 3 shows a cross-sectional side view of illustrative connector 310 coupled to power PCB 320 and signal PCB 330, with isolation layer 340, in accordance with some embodiments of the present disclosure. Assembly 300 includes stack 350, which includes power PCB 320, isolation layer 340, and signal PCB 330, and a connector array that includes connector 310 (e.g., a RJ-45 socket for PoE). To illustrate, assembly 300 may be similar to assembly 200 of FIG. 2, with insulating layer 340 included in stack 350 to electrically isolate power PCB 320 from signal PCB 330. In some embodiments (not shown), an isolation layer is included between the connector array and power PCB 320.

Connector 310 includes signal pins 311 and power pins 312. Signal pins 311, which are longer than power pins 312 as illustrated, pass through power PCB 320 and isolation layer 340 without electrically contacting electronic circuitry or conductors of power PCB 320, and engage with corresponding electrical terminals of signal PCB 330. Power pins 312 engage with corresponding electrical terminals of power PCB 320.

Axis 370 provides an indicator of direction of assembly 300. For example, connector 310, which may include a RJ-45 connector, is stacked over power PCB 320, which is stacked over isolation layer 340, which is in turn stacked over signal PCB 330.

Figure 4:
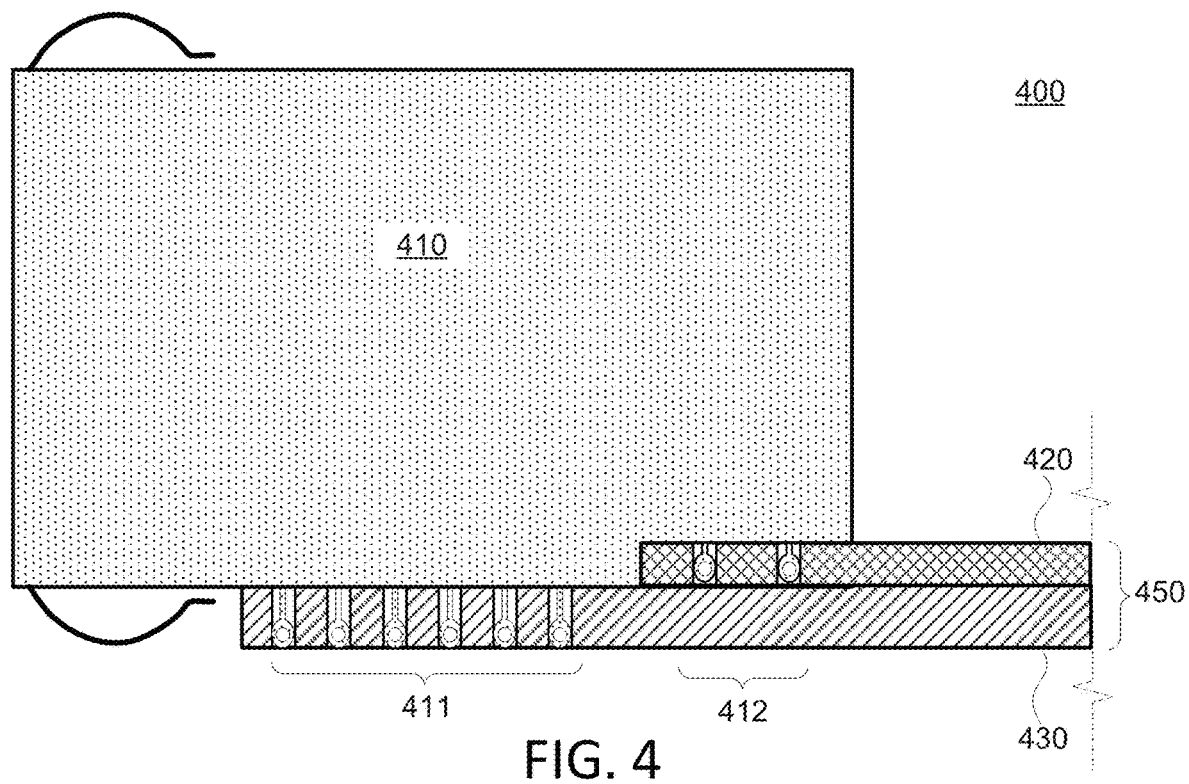
FIG. 4 shows a cross-sectional side view of an illustrative connector coupled to a power PCB and signal PCB, in accordance with some embodiments of the present disclosure.

FIG. 4 shows a cross-sectional side view of illustrative connector 410 coupled to power PCB 420 and signal PCB 430, in accordance with some embodiments of the present disclosure. Assembly 400 includes stack 450, which includes power PCB 420 and signal PCB 430, and a connector array that includes connector 410 (e.g., a RJ-45 socket for PoE). To illustrate, assembly 400 may be similar to assembly 200 of FIG. 2, wherein signal pins 411 do not pass through power PCB 420 to engage with electrical terminals of signal PCB 430.

In some embodiments, power PCB 420 and signal PCB 430 are mechanically affixed to each other to provide stiffness. In some embodiments, engagement of signal pins 411 with signal PCB 430 and engagement of power pins 412 with power PCB 420 provides mechanical affixing. In some embodiments, for example, assembly 400 may require further affixing between power PCB 420 and signal PCB 430, because signal pins 411 do not pass through a portion of power PCB 420. In some embodiments, signal pins 411 and power pins 412 may have the same length, although arranged at different spatial planes (e.g., power pins 412 are above signal pins 411 as illustrated.

The arrangement of signal pins 411 may, in some embodiments, forgo further electrical isolation partially or entirely between signal pins 411 and power PCB 420. For example, power PCB 420 need not be configured to provide electrical isolation around signal pins 411 because signal pins 411 do not pass through any portion of power PCB 420. In some embodiments, an isolation layer may be included between power PCB 420 and signal PCB 430. For example, the isolation layer, if included, may extend between power PCB 420 and signal PCB 430 such that signal pins 411 and power pins 412 pass through the isolation layer. In a further example, the isolation layer, if included, may extend between power PCB 420 and signal PCB 430 such that only power pins 412 pass through the isolation layer. In some embodiments, signal PCB 430 is of the same design as a non-PoE board, and power PCB 420 includes electrical isolation at the interface with signal PCB 430.

In some embodiments, connector 410 may include a step, recess, or other suitable feature to accommodate the differing lengths of power PCB 420 and signal PCB 430. As illustrated, connector 410 includes a step to accommodate power PCB 420. Connector 410, power PCB 420, and signal PCB 430 may have any suitable interfaces, having any suitable profile.

Figure 5:
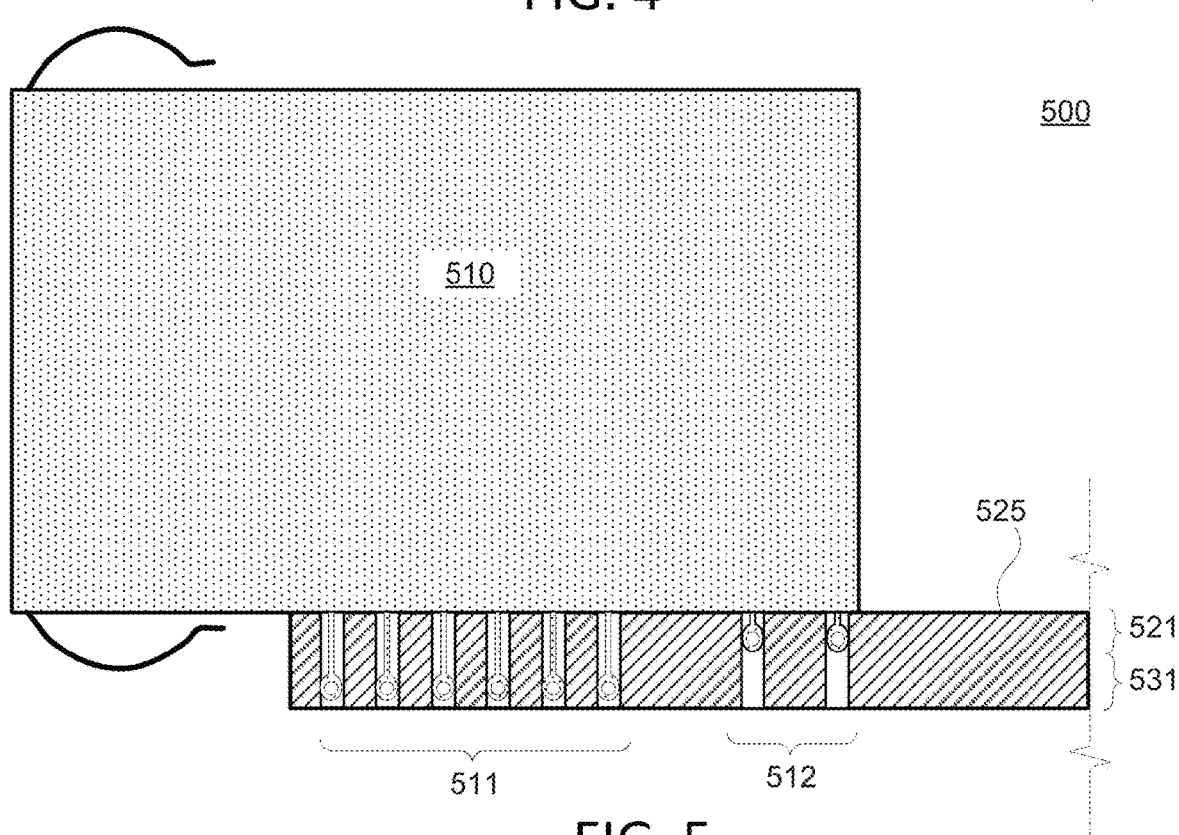
FIG. 5 shows a cross-sectional side view of an illustrative connector coupled to a single PCB, in accordance with some embodiments of the present disclosure.

FIG. 5 shows a cross-sectional side view of illustrative connector 510 coupled to PCB 525, in accordance with some embodiments of the present disclosure. As illustrated, PCB 525 includes both a signal domain (e.g., signal domain 531) and a power domain (e.g., power domain 521), separated as different layers of a single PCB and electrically isolated from each other. Assembly 500 includes PCB 525, and a connector array that includes connector 510 (e.g., a RJ-45 socket for PoE). Connector 510 includes signal pins 511 and power pins 512 (shield pins are not illustrated but may be included in some embodiments). Signal pins 511 (e.g., six pins as illustrated) are longer than power pins 512 as illustrated. Signal pins 511 pass through power domain 521 of PCB 525 without electrically contacting electronic circuitry or conductors of power domain 521, and engage with corresponding electrical terminals of signal domain 531. Power pins 512 (e.g., two pins as illustrated) engage with corresponding electrical terminals of power domain 521.

In some embodiments, PCB 525 is fabricated having two completely electrically isolated domains. For example, power domain 521 may include cheaper, more easily fabricated features, while signal domain 531, may include features at finer resolution for signal processing purposes. In some embodiments, circuitry of power domain 521 does not cross, intersect, or otherwise intrude upon the circuitry of signal domain 531. For example, because signal pins 511 are longer than power pins 512, and signal domain 531 is beneath power domain 521, only signal pins 511 themselves need cross power domain 531. The crossing may include, for example, through holes, optionally with further isolation, that accommodate signal pins 511 without causing electrical contact between signal pins 511 and circuitry of power domain 521.

Figure 6:
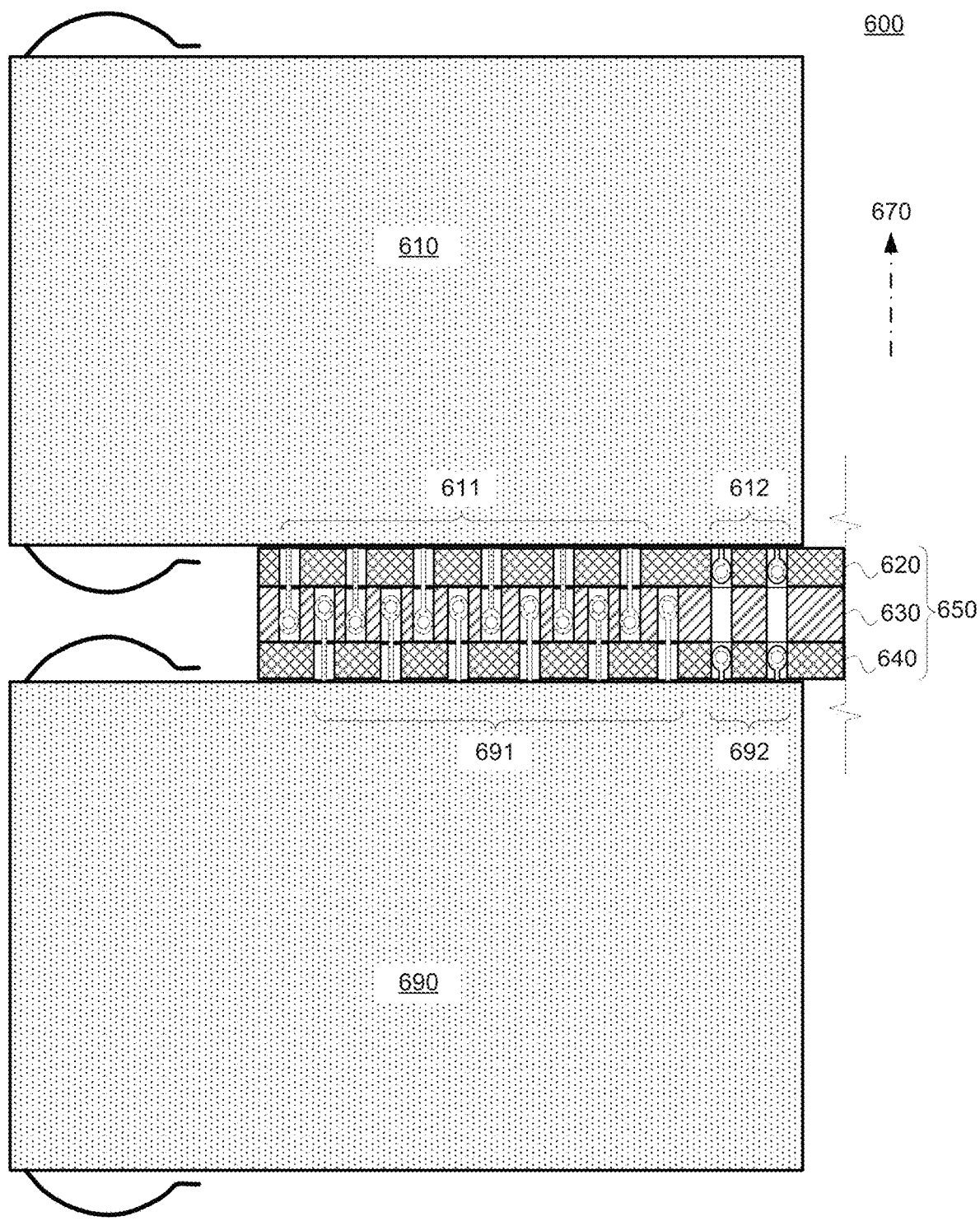
FIG. 6 shows a cross-sectional side view of two illustrative connectors of different arrays coupled to a signal PCB and respective power PCBs, in accordance with some embodiments of the present disclosure.

FIG. 6 shows a cross-sectional side view of two illustrative connectors of different arrays coupled to a signal PCB and respective power PCBs, in accordance with some embodiments of the present disclosure. Assembly 600 includes stack 650, which includes power PCB 620, signal PCB 630, and power PCB 640, and two connector arrays that respectively include connector 610 (e.g., a RJ-45 socket for PoE) and connector 690 (e.g., a RJ-45 socket for PoE). For example, assembly 600 corresponds to network devices having two rows of RJ-45 sockets configured for PoE functionality. In a further example, connector 690 may have the same orientation as connector 610, or have an orientation rotated 180° from that of connector 610 (e.g., be upside-down as viewed from the connector face).

Connector 610 includes signal pins 611 and power pins 612 (shield pins are not illustrated but may be included in some embodiments). Signal pins 611 (e.g., six pins as illustrated), which are longer than power pins 612 as illustrated, pass through power PCB 620 without electrically contacting electronic circuitry or conductors of power PCB 620, and engage with corresponding electrical terminals of signal PCB 630. Power pins 612 (e.g., two pins as illustrated) engage with corresponding electrical terminals of power PCB 620.

Connector 690 includes signal pins 691 and power pins 692 (shield pins are not illustrated but may be included in some embodiments). Signal pins 691 (e.g., six pins as illustrated), which are longer than power pins 692 as illustrated, pass through power PCB 640 without electrically contacting electronic circuitry or conductors of power PCB 640, and engage with corresponding electrical terminals of signal PCB 630. Power pins 692 (e.g., two pins as illustrated) engage with corresponding electrical terminals of power PCB 640.

In some embodiments, power PCB 620, power PCB 640, and signal PCB 230 are mechanically affixed to each other to provide stiffness. In some embodiments, engagement of signal pins 611 and 691 with signal PCB 630 and engagement of power pins 612 and 692 with respective power PCBs 620 and 640 provides mechanical affixing. For example, signal pins 611, signal pins 691, power pins 612, power pins 692, or a combination thereof, may engage respective PCBs by a press fit with corresponding terminals (as illustrated), mechanical crimping, soldering, any other suitable technique for affixing pins of a socket to a PCB, or any combination thereof.

The arrangement of signal pins 611 and 691 connected to a signal domain (e.g., of signal PCB 630) and power pins 612 and 692 connected to respective power domains (e.g., of respective power PCBs 620 and 640) forgoes the need for further electrical isolation partially or entirely. For example, power PCBs 620 and 640, and signal PCB 230 may be designed to provide necessary electrical isolation at their mating interface. In some embodiments, an isolation layer may be included between power PCB 620 and signal PCB 630, between power PCB 640 and signal PCB 630, or both. In some embodiments, signal PCB 630 is of the same design as a non-PoE board, and power PCBs 620 and 640 include electrical isolation at the interface with signal PCB 630. Accordingly, in some circumstances, the assemblies of the present disclosure allow less expensive and intrusive electric power isolation between the signal pin field (e.g., such as signal pins 611 and 691) and power pin field (e.g., such as power pins 612 and 692) of the corresponding one or more PCBs.

Axis 670 provides an indicator of direction of assembly 600. For example, connector 610, which may include a RJ-45 connector, is arranged over power PCB 620, which is stacked over signal PCB 630, which is stacked over power PCB 640, under which is arranged connector 690. Although not shown in FIG. 6, connectors 610 and 690 may be one connector of a respective plurality of connectors of respective connector arrays. Power PCB 620, power PCB 640, and signal PCB 630 may each include a plurality of corresponding sets of electrical terminals with which the signal pins and power pins engage.

Although not illustrated in FIG. 6, power PCBs and signal PCBs may be stacked in a different order. For example, in some embodiments, a first signal PCB is stacked over a power PCB, and the power PCB is stacked over a second signal PCB. Accordingly, in such an arrangement, the power pins of each connector array are longer than the respective signal pins and pass through the respective signal PCBs without electrically contacting the signal PCBs or conductors thereof. Any suitable arrangement of multiple power PCBs, multiple signal PCBs, or a combination thereof, may be used in accordance with the present disclosure.

Figure 7:
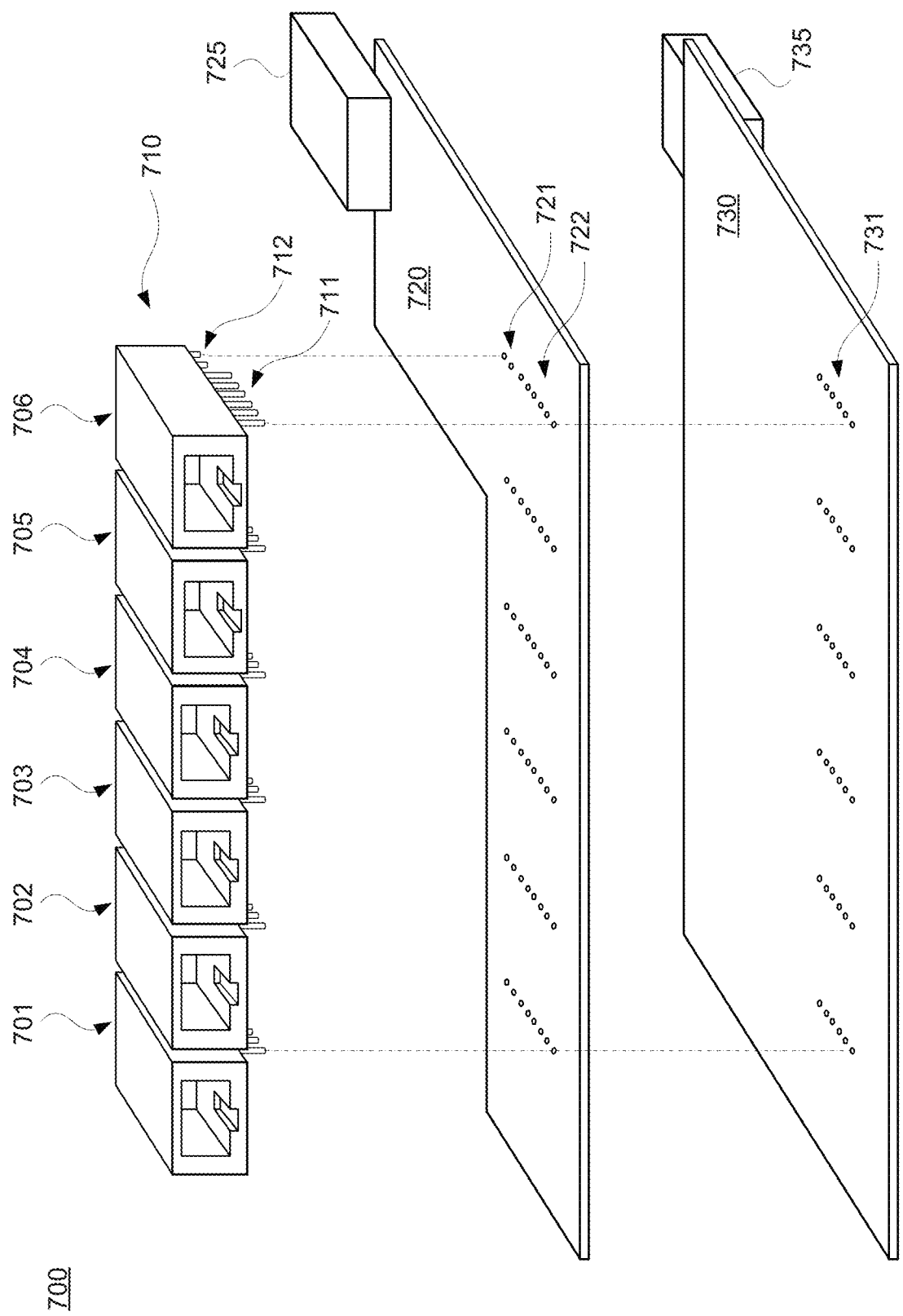
FIG. 7 shows a perspective, partially exploded, view of an illustrative connector array, a power PCB, and a signal PCB, in accordance with some embodiments of the present disclosure.

FIG. 7 shows a perspective, partially exploded, view of illustrative connector array 710, power PCB 720, and signal PCB 730, in accordance with some embodiments of the present disclosure. Assembly 700 includes power PCB 720, signal PCB 730, and connector array 710 that includes connectors 701-706 (e.g., RJ-45 sockets for PoE). Each of connectors 701-706 include signal pins and power pins (shield pins are not illustrated but may be included in some embodiments). As illustrated, signal pins 711 (e.g., six per connector, as illustrated) are longer than power pins 712 (e.g., two per connector as illustrated). Signal pins 711 pass through holes or vias 722 of power PCB 720 without electrically contacting electronic circuitry or conductors of power PCB 720, and engage with corresponding electrical terminals 731 of signal PCB 730. Power pins 712 engage with corresponding electrical terminals 721 of power PCB 720. Dot-dashed lines in FIG. 7 shows an illustrative assembly path from the exploded view. As illustrated, each of connectors 701-706 has an associated row of pins (e.g., signal pins 711 and power pins 712 for connector 706). It will be understood that pins may be arranged in any suitable way, in accordance with the present disclosure. For example, pins may be arranged in a cluster, multiple rows, staggered rows, any other suitable arrangement, or any combination thereof. In a further example, pins from all connectors of an array (e.g., pins from connectors 701-706) may be grouped together. To illustrate, the array of connectors may be affixed to a structure having conductors to route the pins to a common location, where a common array of pins (e.g., an array including pins corresponding to each connector) engages with suitable PCBs.

As illustrated, power PCB 720 includes connector 725 configured to transmit electric power signals. As illustrated, signal PCB 730 includes connector 735 configured to transmit network communications signals. In some embodiments, each board includes a connector, thus maintaining isolation of the signal domain and power domain. For example, because the signal domain and power domains do not share a connector, electrical isolation may be easier and cheaper to achieve. In some embodiments, power PCB 720 and signal PCB 730 are electrically coupled at connectors 725 and 735. For example, connectors 725 and 735 may engage each other when assembled, and an array of electrical terminals of connectors 725 and 735 may include both signal domain circuitry and power domain circuitry.

In some embodiments, power PCB 720, signal PCB 730, or both, include one or more alignment features to ensure in-plane and out-of-plane alignment between power PCB 720 and signal PCB 730. In some embodiments, power PCB 720 and signal PCB 730 are mechanically affixed (e.g., by threaded fasteners, crimping, press-fit, soldering, bonding, or other affixing technique) to ensure in-plane and out-of-plane alignment between power PCB 720 and signal PCB 730. As illustrated, signal PCB 730 and power PCB 720 need not have the same shape and footprint. For example, power PCB 720 may include less area or footprint, and accordingly less material, relative to signal PCB 730, which may provide for cost savings, simplified fabrication, or both. In a further example, power PCB 720 may include the same area or footprint as signal PCB 730.

Figure 8:
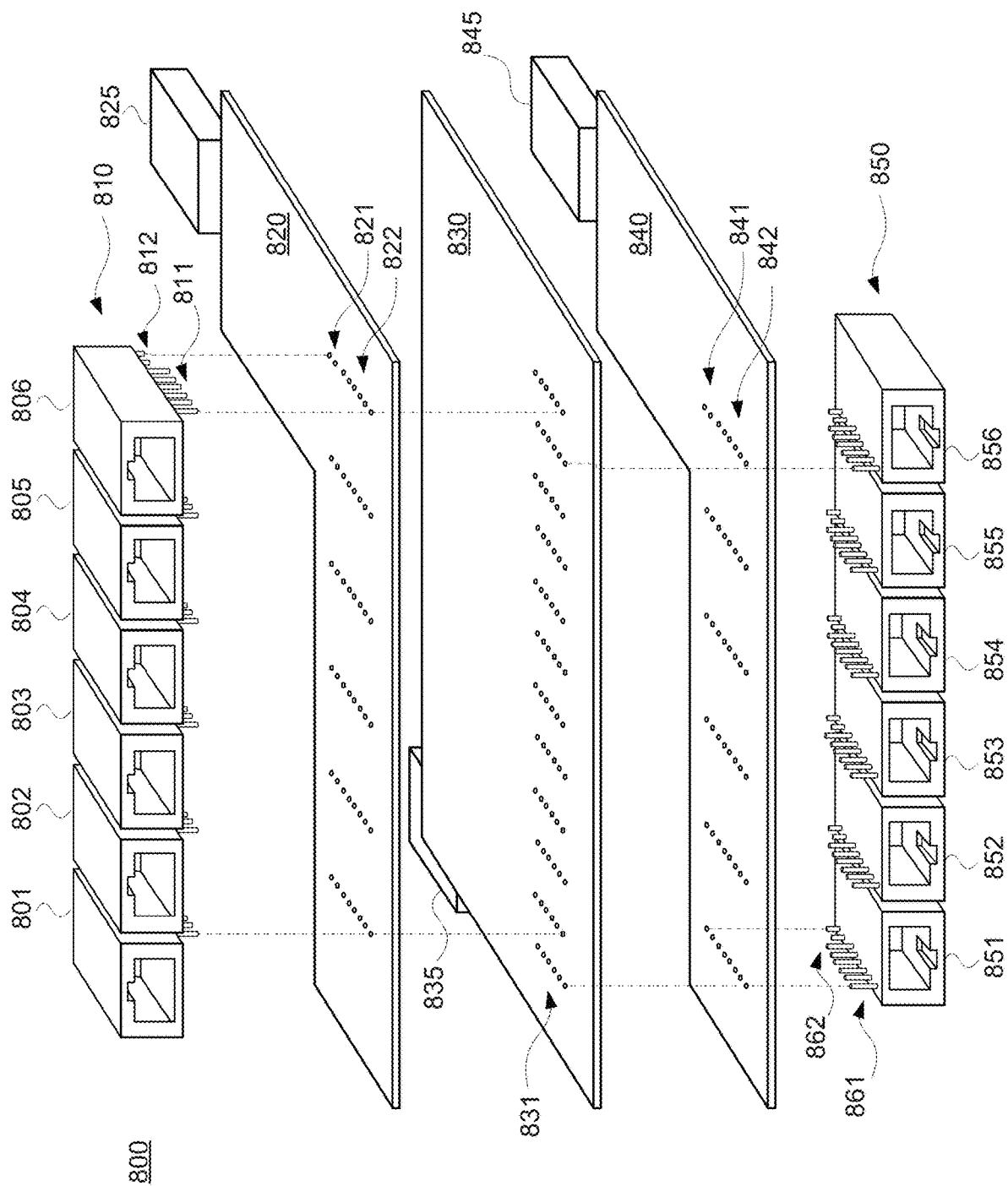
FIG. 8 shows a perspective, partially exploded view of illustrative connector arrays, power PCBs, and a signal PCB, in accordance with some embodiments of the present disclosure.

FIG. 8 shows a perspective, partially exploded, view of illustrative connector arrays 810 and 850, power PCBs 820 and 840, and signal PCB 830, in accordance with some embodiments of the present disclosure. Assembly 800 includes power PCB 820, signal PCB 830, power PCB 840, connector array 810, and connector array 850. Connector array 810 includes connectors 801-806 (e.g., RJ-45 sockets for PoE), and connector array 850 includes connectors 851-856 (e.g., RJ-45 sockets for PoE), thus forming a two-row arrangement of connectors. Each of connectors 801-806 and 851-856 include signal pins and power pins (shield pins are not illustrated but may be included in some embodiments).

As illustrated, signal pins 811 (e.g., six per connector, as illustrated) are longer than power pins 812 (e.g., two per connector as illustrated). Signal pins 811 pass through holes or vias 822 of power PCB 820 without electrically contacting electronic circuitry or conductors of power PCB 820, and engage with corresponding electrical terminals 831 of signal PCB 830. Power pins 812 engage with corresponding electrical terminals 821 of power PCB 820. Dot-dashed lines in FIG. 8 shows an illustrative assembly path from the exploded view. As illustrated, each of connectors 801-806 has an associated row of pins (e.g., signal pins 811 and power pins 812 for connector 806). It will be understood that pins may be arranged in any suitable way, in accordance with the present disclosure. For example, pins may be arranged in a cluster, multiple rows, staggered rows, any other suitable arrangement, or any combination thereof. In a further example, pins from all connectors of an array (e.g., pins from connectors 801-806) may be grouped together. To illustrate, the array of connectors may be affixed to a structure having conductors to route the pins to a common location, where a common array of pins (e.g., an array including pins corresponding to each connector) engages with suitable PCBs.

As illustrated, signal pins 861 (e.g., six per connector, as illustrated) are longer than power pins 862 (e.g., two per connector as illustrated). Signal pins 861 pass through holes or vias 842 of power PCB 840 without electrically contacting electronic circuitry or conductors of power PCB 840, and engage with corresponding electrical terminals 831 of signal PCB 830. Power pins 862 engage with corresponding electrical terminals 841 of power PCB 840. Dot-dashed lines in FIG. 8 shows an illustrative assembly path from the exploded view. As illustrated, each of connectors 851-856 has an associated row of pins (e.g., signal pins 861 and power pins 862 for connector 856).

As illustrated, power PCB 820 includes connector 825, and power PCB 840 includes connector 845, each configured to transmit electric power signals. As illustrated, signal PCB 830 includes connector 835 configured to transmit network communications signals. In some embodiments, each board includes a connector, thus maintaining isolation of the signal domain and power domain. For example, because the signal domain and power domains do not share a connector, electrical isolation may be easier and cheaper to achieve.

In some embodiments, power PCB 820, power PCB 840, signal PCB 830, or a combination thereof, include one or more alignment features to ensure in-plane and out-of-plane alignment. In some embodiments, power PCB 820, power PCB 840, and signal PCB 830 are mechanically affixed (e.g., by threaded fasteners, crimping, press-fit, soldering, bonding, or other affixing technique) to ensure in-plane and out-of-plane alignment among power PCB 820, power PCB 840, and signal PCB 830. As illustrated, signal PCB 830 and power PCBs 820 and 840 need not have the same shape and footprint. Power PCB 820 and power PCB 840 may have, but need not have, similar shapes, connectors, or other features. For example, power PCB 820 and power PCB 840 may be the same, similar, or different in design.

The foregoing is merely illustrative of the principles of this disclosure and various modifications may be made by those skilled in the art without departing from the scope of this disclosure. The above described embodiments are presented for purposes of illustration and not of limitation. The present disclosure also can take many forms other than those explicitly described herein. Accordingly, it is emphasized that this disclosure is not limited to the explicitly disclosed methods, systems, and apparatuses, but is intended to include variations to and modifications thereof, which are within the spirit of the following claims.

What is claimed is:

1. An apparatus comprising:
a first circuit board comprising a plurality of signal traces configured to carry communication signals;
a second circuit board comprising a plurality of power traces;
a plurality of sockets, wherein each socket comprises:
a first set of pins having a first length and configured to connect to a set of signal traces from the plurality of signal traces, and
a second set of pins having a second length and configured to connect to a set of power traces from the plurality of power traces.

2. The apparatus of claim 1, wherein:
the first length is longer than the second length;
the second circuit board is stacked over the first circuit board;
the plurality of sockets are stacked over the second circuit board;
the first set of pins engage with the first circuit board; and
the second set of pins engage with the second circuit board.

3. The apparatus of claim 1, wherein the first set of pins pass through the second circuit board without making electrical contact with the second circuit board.

4. The apparatus of claim 1, wherein:
the second length is longer than the first length;
the first circuit board is stacked over the second circuit board;
the plurality of sockets are stacked over the first circuit board;
the first set of pins engage with the first circuit board; and
the second set of pins engage with the second circuit board.

5. The apparatus of claim 4, wherein the second set of pins pass through the first circuit board without making electrical contact with the first circuit board.

6. The apparatus of claim 1, wherein:
the first set of pins mechanically engage with the first circuit board; and
the second set of pins mechanically engage with the second circuit board.

7. The apparatus of claim 1, further comprising an isolation layer arranged between the first circuit board and the second circuit board to provide electrical isolation.

8. The apparatus of claim 1, wherein the plurality of sockets are RJ45 connector sockets, and wherein the first set of pins and the second set of pins provide Power-over-Ethernet (PoE).

9. An apparatus comprising:
a first circuit board comprising a plurality of signal traces configured to carry communication signals;
a second circuit board comprising a plurality of first power traces;
a third circuit board comprising a plurality of second power traces;
a plurality of first sockets, wherein each first socket comprises:
a first set of pins having a first length and configured to connect to a set of signal traces from the plurality of signal traces, and
a second set of pins having a second length and configured to connect to a set of power traces from the plurality of first power traces; and
a plurality of second sockets, wherein each second socket comprises:
a third set of pins having a third length and configured to connect to a set of signal traces from the plurality of signal traces, and a fourth set of pins having a fourth length and configured to connect to a set of power traces from the plurality of second power traces.

10. The apparatus of claim 9, wherein:
the first length is longer than the second length;
the third length is longer than the fourth length;
the second circuit board is stacked over the first circuit board;
the first circuit board is stacked over the third circuit board;
the plurality of first sockets are stacked over the second circuit board;
the first set of pins engage with the first circuit board;
the second set of pins engage with the second circuit board;
the plurality of second sockets are stacked under the third circuit board;
the third set of pins engage with the first circuit board; and
the fourth set of pins engage with the third circuit board.

11. The apparatus of claim 9, wherein the third length is equal to the first length, and wherein the fourth length is equal to the second length.

12. The apparatus of claim 9, wherein:
the first set of pins pass through the second circuit board without making electrical contact with the second circuit board; and
the third set of pins pass through the third circuit board without making electrical contact with the third circuit board.

13. The apparatus of claim 9, wherein:
the first set of pins mechanically engage with the first circuit board; and
the second set of pins mechanically engage with the second circuit board.

14. The apparatus of claim 9, further comprising an isolation layer arranged between the first circuit board and the second circuit board to provide electrical isolation.

15. The apparatus of claim 9, wherein the first plurality of sockets are RJ45 connector sockets, wherein and the second plurality of sockets are RJ45 connector sockets, wherein the first set of pins and the second set of pins provide Power-over-Ethernet (PoE), and wherein the third set of pins and the fourth set of pins provide PoE.

16. An apparatus comprising:
a circuit board stack comprising: a first circuit board comprising a plurality of signal traces configured to carry communication signals arranged on a first side of the circuit board stack;
a second circuit board comprising a plurality of power traces arranged on a second side of the circuit board stack;
a plurality of first sockets arranged at the first side of the circuit board stack, wherein each first socket comprises:
a first set of pins having a first length and configured to connect to a set of signal traces from the plurality of signal traces, and
a second set of pins having a second length and configured to connect to a set of power traces from the plurality of power traces; and
a plurality of second sockets arranged at the second side of the circuit board stack, wherein each second socket comprises:
a third set of pins having a third length and configured to connect to a set of signal traces from the plurality of signal traces, and
a fourth set of pins having a fourth length and configured to connect to a set of power traces from the plurality of second power traces.

17. The apparatus of claim 16, wherein:
the first length is shorter than the second length; and
the third length is longer than the fourth length.

18. The apparatus of claim 16, wherein:
the first length is equal to the fourth length; and
the second length is equal to the third length.

19. The apparatus of claim 16, wherein:
the second set of pins pass through the first circuit board without making electrical contact with the first circuit board; and
the third set of pins pass through the second circuit board without making electrical contact with the second circuit board.

20. The apparatus of claim 16, wherein the plurality of first sockets are RJ45 connector sockets, wherein and the plurality of second sockets are RJ45 connector sockets, wherein the first set of pins and the second set of pins provide Power-over-Ethernet (PoE), and wherein the third set of pins and the fourth set of pins provide PoE.

* * * * *